(12) United States Patent
Klebanov et al.

(10) Patent No.: US 10,145,904 B2
(45) Date of Patent: Dec. 4, 2018

(54) MULTI-DIE INTEGRATED CIRCUIT DEVICE WITH OVERVOLTAGE PROTECTION

(71) Applicant: Allegro MicroSystems, LLC, Manchester, NH (US)

(72) Inventors: Maxim Klebanov, Waltham, MA (US); Washington Lamar, Mount Vernon, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/245,689

(22) Filed: Aug. 24, 2016

(65) Prior Publication Data
US 2018/0061820 A1 Mar. 1, 2018

(51) Int. Cl.
| | | |
|---|---|---|
| *H01L 27/02* | (2006.01) | |
| *H01L 43/02* | (2006.01) | |
| *H01L 43/12* | (2006.01) | |
| *G01R 33/00* | (2006.01) | |
| *H01L 23/60* | (2006.01) | |

(52) U.S. Cl.
CPC .......... *G01R 33/0076* (2013.01); *H01L 23/60* (2013.01); *H01L 43/02* (2013.01); *H01L 43/12* (2013.01)

(58) Field of Classification Search
CPC ..... H01L 27/0248; H01L 43/02; H01L 43/12; G01R 33/0076
USPC ................................................ 257/427, 686
See application file for complete search history.

(56) References Cited

U.S. PATENT DOCUMENTS

| | | | |
|---|---|---|---|
| 5,301,084 A | 4/1994 | Miller | |
| 8,018,002 B2 | 9/2011 | Salman et al. | |
| 8,040,645 B2 | 10/2011 | Jalilizeinali et al. | |
| 9,941,224 B2 | 4/2018 | Lamar et al. | |
| 2007/0075409 A1 | 4/2007 | Letterman, Jr. et al. | |
| 2008/0265389 A1* | 10/2008 | Hsu ..................... | H01L 23/5382 257/686 |
| 2011/0026173 A1 | 2/2011 | Karp | |
| 2011/0175699 A1* | 7/2011 | Huss ..................... | H01H 85/32 337/143 |
| 2014/0098448 A1* | 4/2014 | Henderson .......... | H01L 23/5256 361/56 |
| 2014/0210108 A1* | 7/2014 | Park ....................... | H01L 24/49 257/777 |

(Continued)

OTHER PUBLICATIONS

U.S. Appl. No. 15/245,699, filed Aug. 24, 2016, Lamar et al.
(Continued)

*Primary Examiner* — Cuong Q Nguyen
*Assistant Examiner* — Tong-Ho Kim
(74) *Attorney, Agent, or Firm* — Daly Crowley Mofford & Durkee LLP

(57) ABSTRACT

An apparatus includes a package, a plurality of external connections extending outside the package, and a first die having a first electrical contact coupled to a first connection of the plurality of external connections. The apparatus also includes a second die having a second electrical contact coupled to a second connection of the plurality of external connections. A conductor is electrically coupled between the first contact and the second contact to allow electrostatic discharge current to flow between the first die to the second die.

25 Claims, 7 Drawing Sheets

(56) References Cited

U.S. PATENT DOCUMENTS

2016/0190918 A1    6/2016  Ho et al.
2017/0250143 A1    8/2017  Wilkinson et al.
2018/0061820 A1    3/2018  Klebanov et al.

OTHER PUBLICATIONS

U.S. Appl. No. 15/053,397, filed Feb. 25, 2016, Wilkinson, et al.
U.S. Non-Final Office Action dated Sep. 28, 2017 for U.S. Appl. No. 15/245,699; 17 pages.
Notice of Allowance dated Dec. 15, 2017 for U.S. Appl. No. 15/245,699; 6 Pages.
Response to U.S. Non-Final Office Action dated Sep. 28, 2017 for U.S. Appl. No. 15/245,699; Response Filed Nov. 30, 2017; 9 Pages.
U.S. Non-Final Office Action dated Jun. 28, 2018 for U.S. Appl. No. 15/907,445; 7 pages.
Response to U.S. Non-Final Office Action dated Jun. 28, 2018 for U.S. Appl. No. 15/907,445; Response filed Jul. 11, 2018; 7 pages.
Response to U.S. Non-Final Office Action dated May 15, 2018 for U.S. Appl. No. 15/053,397; Response filed May 29, 2018; 11 Pages.
U.S. Non-Final Office Action dated May 15, 2018 for U.S. Appl. No. 15/053,397; 7 Pages.

* cited by examiner

MULTI-DIE INTEGRATED CIRCUIT DEVICE WITH OVERVOLTAGE PROTECTION

FIELD

This application relates to overvoltage and/or electrostatic discharge (ESD) protection and, more particularly, to overvoltage and/or ESD protection for multi-die integrated circuit (IC) devices.

BACKGROUND

Electronic devices sometimes operate in environments that can damage the components and devices. Installation of a device in an automobile, for example, can expose electronic devices to stress conditions that can cause damage to the part. As an example, static charge that has built up can transfer to the electronic device during handling, installation, or inspection. Devices used in manufacturing environments can also experience power fluctuations. If, for example, a power-hungry system or process draws on the manufacturing plant's electrical system, interruptions or fluctuations in power can occur that affect any device connected to the plant's power infrastructure. If the electronic device has multiple semiconductor die, such stresses can cause electrical current to arc between the die and potentially damage the electronic device.

For example, electronic devices may be subject to electrical overstress ("EOS") conditions such as an electrostatic discharge ("ESD") event occurring between exposed pins or terminals of the device. These events can occur if there is a system fault or if the electronic device is exposed to an external charge. For example, the human body can store a charge that can correlate into a stored voltage as high as 25 kV. If a charged body touches an external terminal of the electronic device, that charge can be transferred to and potentially damage the device. Many devices contain ESD protection circuits that provide paths for current due to ESD events to flow without damaging internal circuitry of the device.

SUMMARY

In an embodiment, an apparatus includes a package, a plurality of external connections extending outside the package, and a first die having a first electrical contact coupled to a first connection of the plurality of external connections. The apparatus also includes a second die having a second electrical contact coupled to a second connection of the plurality of external connections. A conductor is electrically coupled between the first contact and the second contact to allow electrostatic discharge to flow from the first die to the second die and vice versa.

In another embodiment, an apparatus includes a package; a plurality of external connections extending outside the package; a first die within the package having one or more first contacts; and a first bond wire coupled between one of the contacts of the first die and one or more of the external connections. The apparatus also includes a second die within the package having one or more second contacts and a second bond wire coupled between one of the contacts of the second die and one or more of the external connections. A conductor is electrically coupled between the first and second bond wires to allow electrostatic discharge to flow between the first die to the second die.

In another embodiment, a method comprises providing an electronic device having a package, two or more dies, a first connection coupled to a first die of the two or more dies, and a second connection coupled to a second die of the two or more dies, the first and second dies including integrated circuits. A conductor coupled between the first and second connections is provided so that electrostatic discharge can flow between the first die to the second die during handing of the electronic device. The conductor is broken to electrically isolate the first die and the second die to allow for operation of the integrated circuits.

BRIEF DESCRIPTION OF THE DRAWINGS

The foregoing features may be more fully understood from the following description of the drawings in which.

Like reference numbers in the drawings may denote like elements.

DETAILED DESCRIPTION

Figure 1:
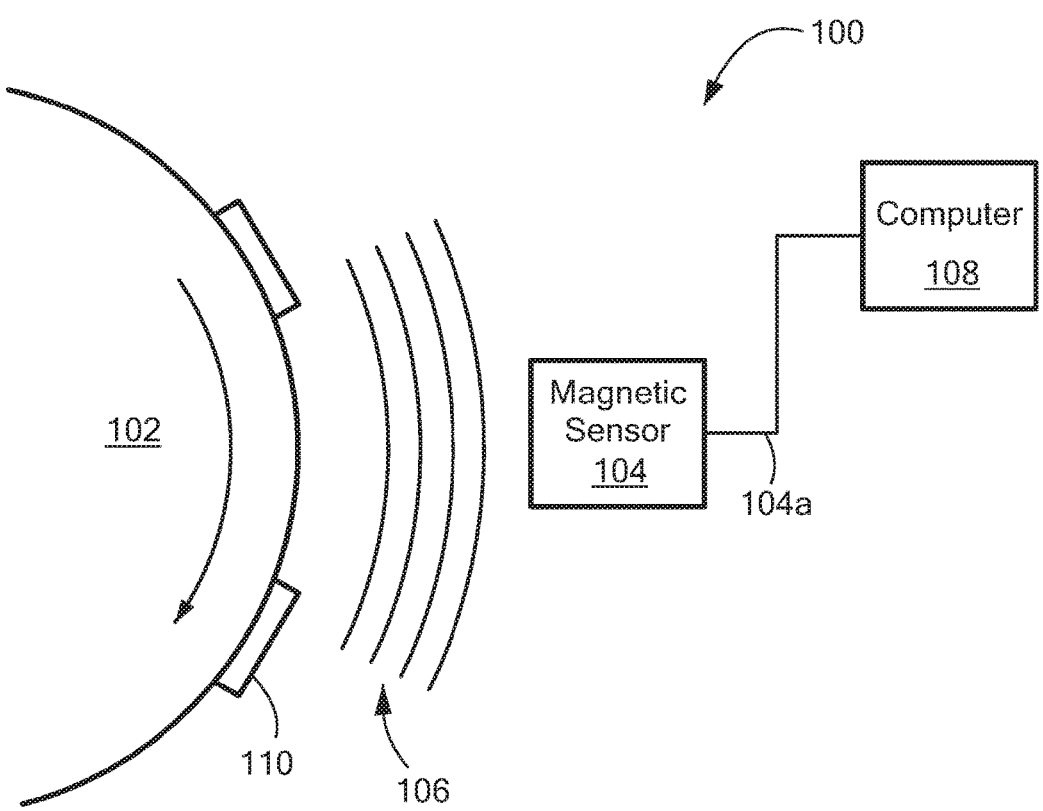
FIG. 1 is a schematic diagram of a system including a magnetic field sensor for detecting a magnetic target.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or perturbations in a magnetic field generated by a back bias magnet where the perturbations are caused by a rotating ferromagnetic article, and a magnetic field sensor that senses a magnetic field density of a magnetic field.

Magnetic field sensors often include driver circuits that can drive an output signal of the magnetic field sensor. These driver circuits often produce an output signal that switches between a high and low depending upon whether a magnetic field sensing element senses a magnetic target or a magnetic field of a particular strength. In some cases, depending upon the location where the magnetic field sensor is installed, the driver circuit may have to drive the output signal across a long conductor or cable harness. For example, if the magnetic field sensor is installed in a vehicle's transmission (e.g. on a camshaft), the conductor harness running from the magnetic field sensor to a central processor may be a few feet or a few meters in length. Such a long cable may be susceptible to EMI from the vehicle's engine, transmission, or other circuits.

FIG. 1 is a block diagram of a system 100 for detecting a target 102. System 100 includes a magnetic field sensor 104 placed adjacent to target 102 so that a magnetic field 106 can be sensed by magnetic field sensor 104.

In an embodiment, target 102 is a magnetic target and produces magnetic field 106. In another embodiment, magnetic field 106 is generated by a magnetic source (e.g. a back-bias magnet or electromagnet) that is not coupled to target 102. In such embodiments, target 102 may be a ferromagnetic target that does not itself tend to generate a magnetic field. In the case where the target is a ferromagnetic target, as target 102 moves through or within magnetic field 106 generated by a back-bias magnet or electromagnet, it causes perturbations to magnetic field 106 that can be detected by magnetic field sensor 104.

Magnetic field sensor 104 may be coupled to a computer 108, which may be a general purpose processor executing software or firmware, a custom processor, or an electronic circuit for processing output signal 104a from magnetic field sensor 104. Output signal 104a may provide information about the speed and direction of target 102 to computer 108, which may then perform operations based on the received speed and direction. In an embodiment, magnetic field sensor 104 changes the state of output signal 104a when the detected magnetic field crosses a predetermined threshold.

In an embodiment, computer 108 is an automotive computer installed in a vehicle and target 102 is a moving part within the vehicle, such as a transmission shaft, a brake rotor, etc. Magnetic field sensor 104 detects the speed and direction of target 102 and computer 108 controls automotive functions (like all-wheel drive, ABS, etc.) in response to the detected speed and direction.

Target 102 can comprise any element capable of affecting magnetic field 106 through motion or proximity. For example, target 102 may be attached to a rotating shaft in an automotive transmission or brake system.

As shown in FIG. 1, target 102 may be a gear having teeth 110. As target 102 moves or rotates, teeth 110 affect magnetic field 106, which can be detected by magnetic field sensor 104. By detecting such changes to magnetic field 106, system 100 can determine speed and/or direction of target 102. Although shown as a rotating gear, target 102 can take on any form capable of being detected by magnetic sensor including, but not limited to: a toothed rack in a rack and pinion system; a gear; a gear with teeth, with magnets (e.g., a ring magnet), or other features on or attached to a shaft; etc. Also, although shown as separate elements, computer 108 and magnetic field sensor 104 may be part of the same circuit, part of the same integrated circuit, or contained in the same package.

Figure 2:
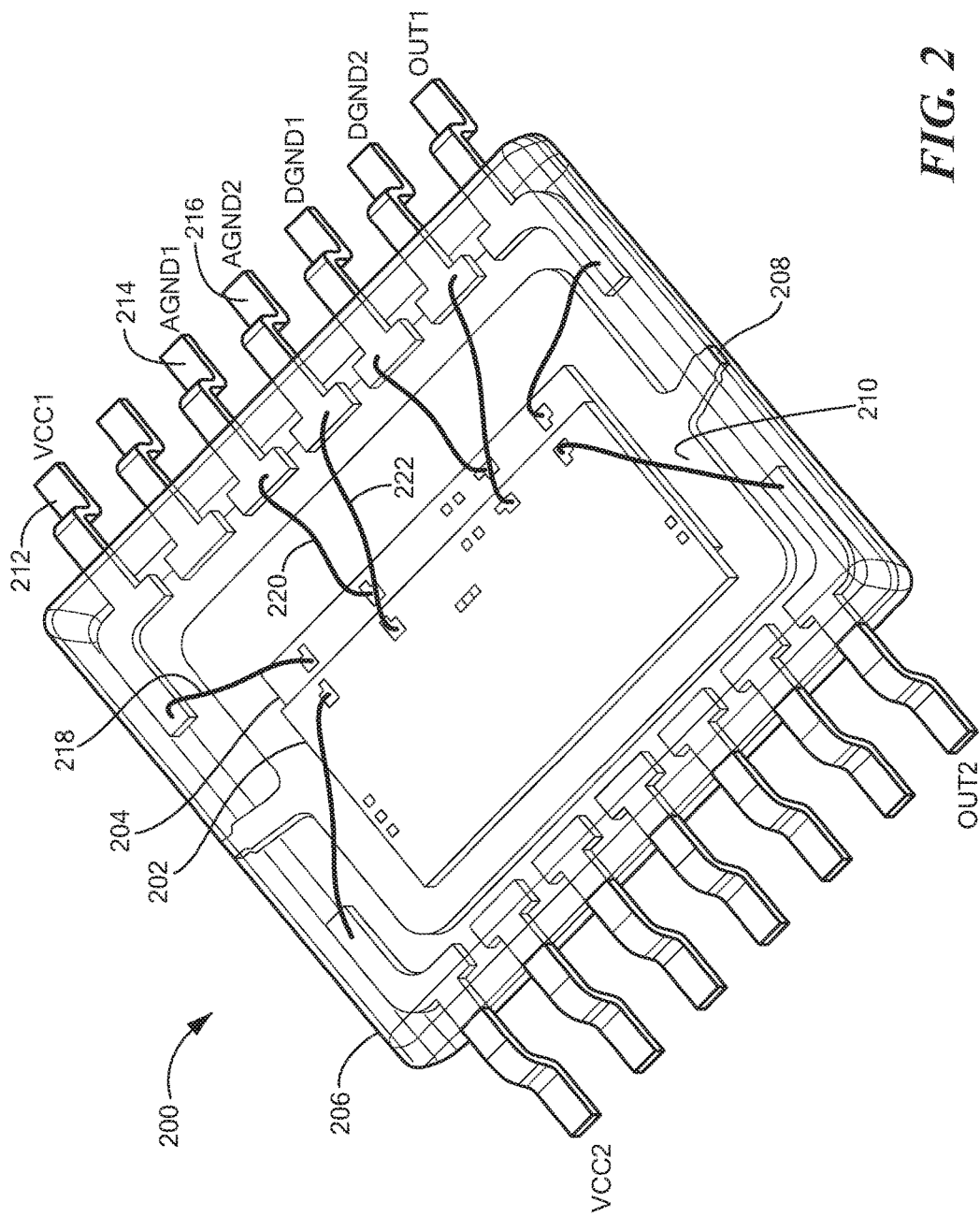
FIG. 2 is an isometric view of an integrated circuit device having multiple semiconductor die.

Referring to FIG. 2, an integrated circuit (IC) device 200 includes a first die 202 and a second die 204 enclosed in an IC package 206. In an embodiment, IC device 200 is a magnetic field sensor similar to or the same as magnetic field sensor 104. The first and second die 202 and 204 may be semiconductor die that each support an electronic circuit. In an embodiment, first and second die 202 and 204 support identical circuits. In this case, the identical circuits may act as redundant circuits to that, if one of the circuits malfunctions, the other may continue to operate. In other embodiments, first and second die 202 and 204 support different circuits that perform different functions.

A lead frame 208 includes a die attach portion 210 on which first and second die 202 and 204 may be attached. In embodiments, first and second die 202 and 204 may be attached by adhesive or other means of attaching semiconductor die to a lead frame known in the art.

As shown in FIG. 2, first die 202 and second die 204 are positioned in an overlapping arrangement. In embodiments, first and second die 202 and 204 may be spaced apart and/or an electrical insulator may be placed between the die so that the die are not electrically coupled to each other. In other embodiments, first and second die may be positioned in other arrangements. For example, they may be positioned side-to-side, corner-to-corner, etc.

In embodiments, first and second die 202 and 204 are positioned so that they may be electrically isolated from each other. First and second die 202 and 204 may also have separate ground and power planes (e.g. separate ground and power leads) so they are electrically isolated from each other.

Leads (such as leads 212, 214, and 216) may be included as part of lead frame 208. Bond wires (such as bond wires 218, 220, and 222) provide electrical connections between leads and electrical contacts (or pads) on first and second die 202 and 204. In the embodiment shown, bond wire 218 provides an electrical connection between lead 212 and second die 204, bond wire 220 provides an electrical connection between lead 214 and second die 204, and bond wire 222 provides an electrical connection between lead 216 and first die 202. As shown in FIG. 2, other bond wires may provide electrical connections between the die and leads as desired by design of integrated circuit 200.

Leads 212-216 may extend outside of package 206 to provide electrical connections to external circuitry. For example, the external portions of leads 212-216 (and other leads of integrated circuit device 200) may be soldered to pads on a printed circuit board in order to connect integrated circuit device 200 to external circuitry supported by the printed circuit board.

Figure 3:
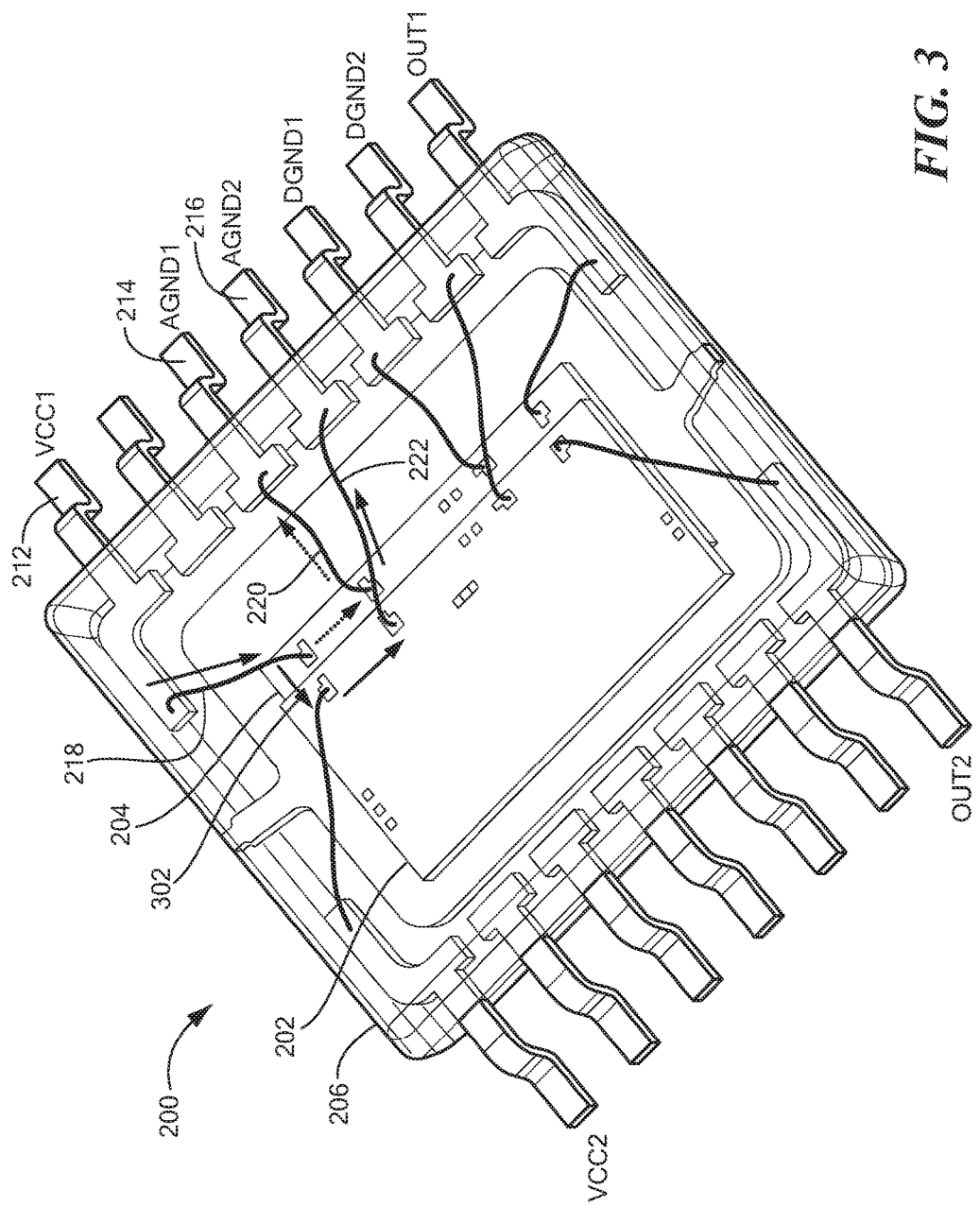
FIG. 3 is an isometric view of an integrated circuit device having multiple semiconductor die.

Referring to FIG. 3, conduction paths through IC device 200 are shown by arrows. In the event of an overvoltage condition, such as an electrostatic discharge (ESD) event, current from the ESD event may flow through IC device 200. For example, if an ESD event occurs between lead 212 and lead 214, current may flow through lead 212, through bond wire 218, through semiconductor die 204, out bond wire 220, and finally out to lead 214. The electronic circuits supported by semiconductor die 204 may include ESD protection circuitry (e.g. ESD clamp circuits and the like) so that the current may flow through semiconductor die 204 without damaging the die or the supported circuitry.

In another example, assume an ESD event occurs between lead 212 and lead 216. In the embodiment shown, lead 212 is coupled to semiconductor die 204 by bond wire 218 and lead 216 is coupled to semiconductor die 202 through bond wire 222. Thus, current flowing from lead 212 to lead 216 may have to flow through both semiconductor die 202 and 204. In this case, current may flow from lead 212, though bond wire 218, and into semiconductor die 204. If semiconductor die 202 and 204 are electrically isolated, as described above, the current may then jump or arc from semiconductor die 204 to semiconductor die 202 as shown by arrow 302. The current may then flow through semiconductor die 202, out to bond wire 222, and finally out to lead 216. If current jumps or arcs from semiconductor die 204 to semiconductor die 202, the electrical arc (and/or heat associated with the electrical arc) may potentially cause damage to one or more of semiconductor die 202 or 204.

Figure 4:
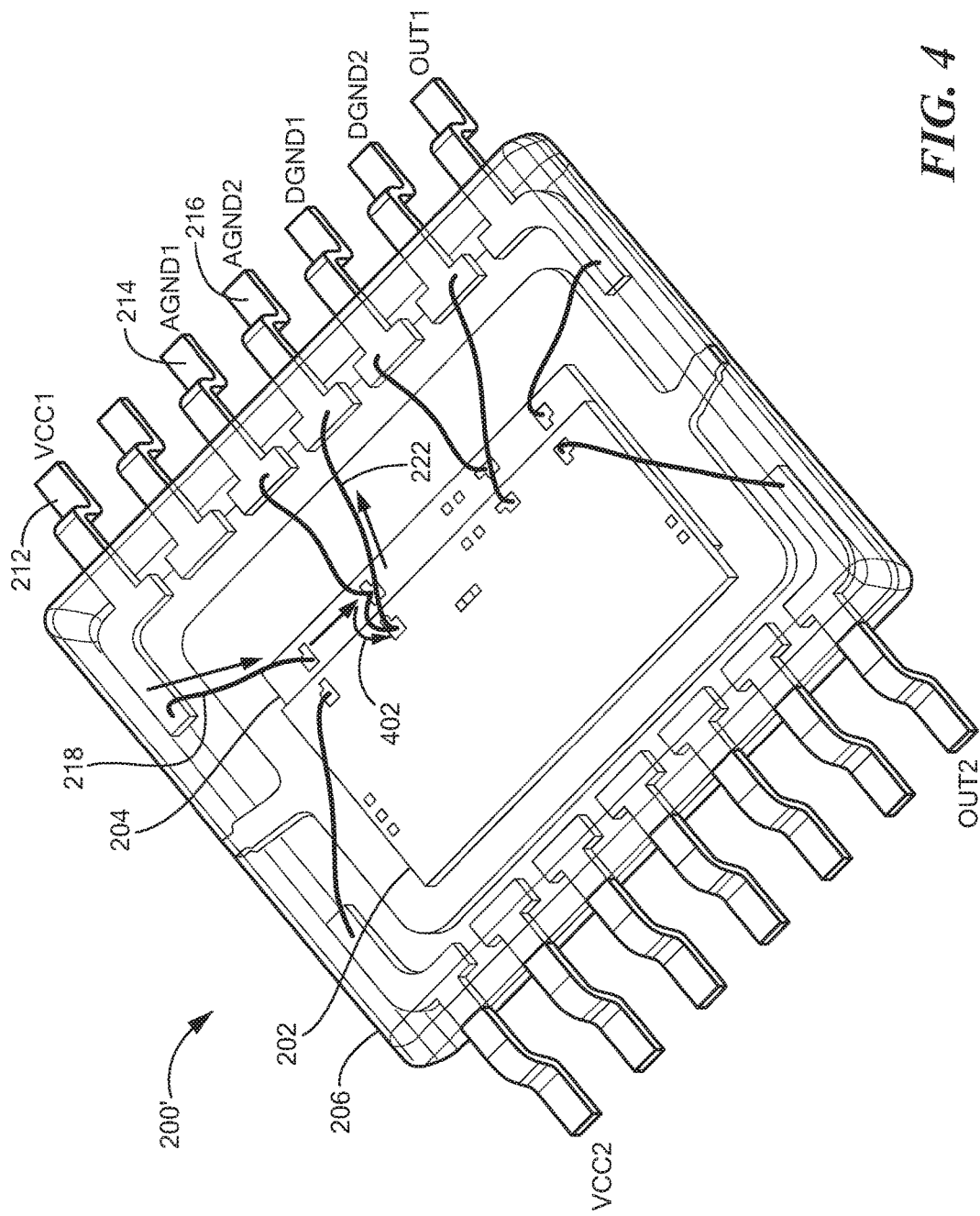
FIG. 4 is an isometric view of an integrated circuit device having multiple semiconductor die and a conductor between the die.

FIG. 4 is an isometric view of another embodiment of an IC device 200'. IC device 200' includes a conductor 402 electrically coupled between bond wire 214 and bond wire 216 to provide a conduction path between semiconductor die 202 and semiconductor die 204. In this embodiment, in the case of an ESD event between leads 212 and 216, the ESD current may flow from lead 212, through bond wire 218, through semiconductor device 204, through conductor 402, through semiconductor 202, through bond wire 222, and finally out to lead 216. In one example, lead 214 may be coupled to a ground connection of semiconductor device 204 and lead 216 may be coupled to a ground connection of semiconductor die 202. Thus, conductor 402 may be coupled between the ground connections of semiconductor devices 202 and 204. In other examples, conductor 402 may be coupled between any bond wires so long as it provides a current conduction path between semiconductor die 202 and 204.

Conductor 402 may be positioned anywhere that provides a conduction path between semiconductor die 202 and 204. As shown in FIG. 4, conductor 402 may be positioned adjacent to or coupled to semiconductor die 202 and/or semiconductor die 204. In another embodiment, conductor 402 may be positioned or coupled to pads on semiconductor die 202 and/or semiconductor die 204. In another example, conductor 402 may be positioned adjacent to leads 214 and 216, or between leads 214 and/or 216 and semiconductor die 202 and/or 204. In another embodiment, conductor 402 may be coupled to leads at a point external to package 206.

In the case of an ESD event, the conduction path provided by conductor 402 may direct the ESD-related current from one semiconductor die to the other. This may prevent or reduce the chance of an electrical arc between the semiconductor die, and thus prevent or reduce the chance of damage due to arcing or heat.

Figure 5:
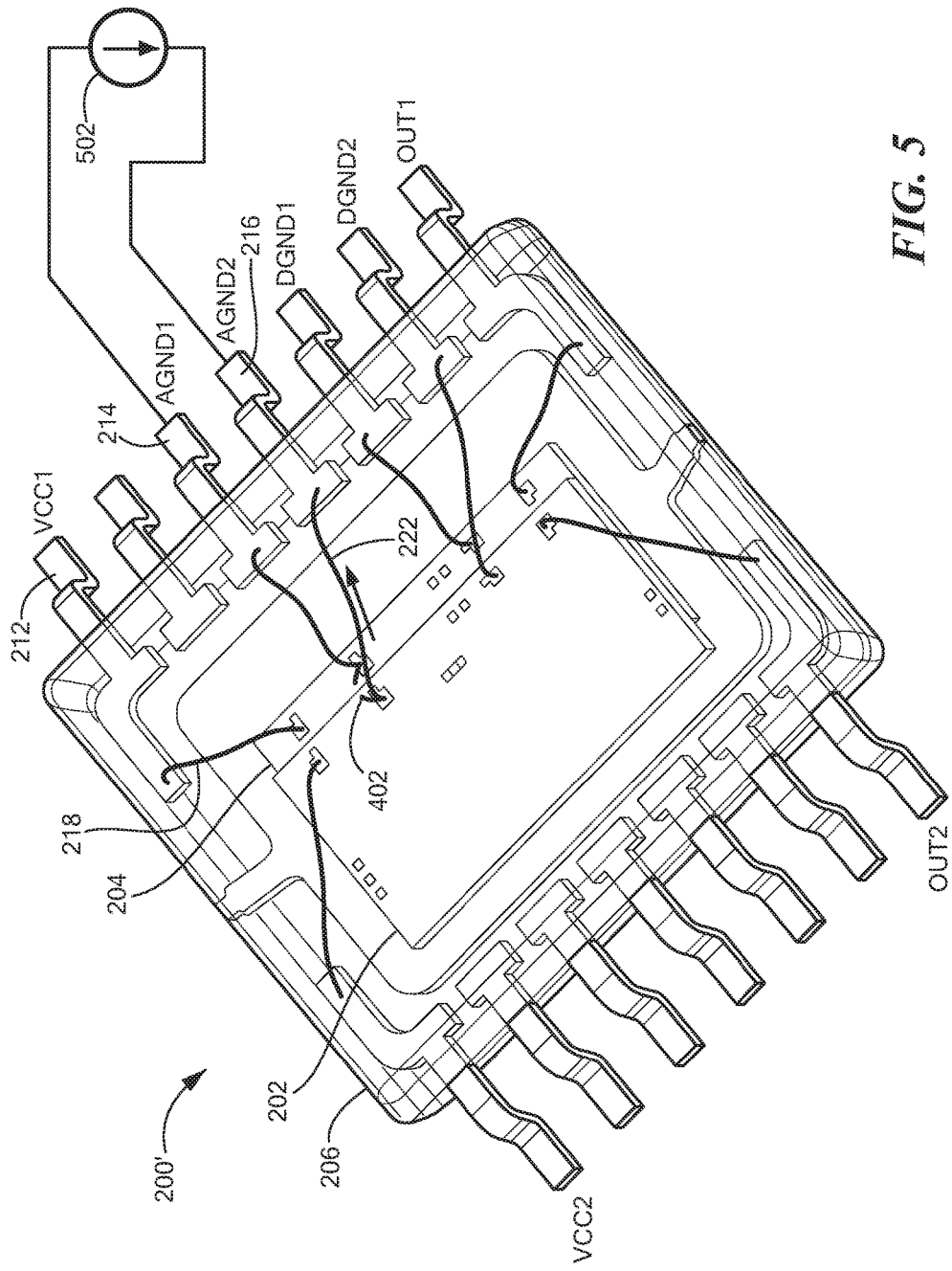
FIG. 5 is an isometric view of an integrated circuit device having multiple semiconductor die and an open fused wire between the die.

Referring to FIG. 5, conductor 402 may be a fused wire between bond wire 220 and bond wire 222. During manufacturing, there is a chance that an ESD event may occur between leads of integrated circuit device 200' due to handling or other factors. However, once semiconductor device 200' is installed in a system (e.g. soldered onto a printed circuit board in an automobile, for example) the chance of an ESD event is reduced. After integrated circuit device 200' is installed in situ, it may be beneficial to electrically isolate semiconductor die 202 and 204 by removing the electrical connection between semiconductor die 202 and 204 provided by conductor 402. If conductor 402 is a fused wire (i.e. a wire that acts as a fuse), the electrical connection can be broken by effectively blowing the fused wire. The fused wire may be or may act as a slow-blow fuse.

In an embodiment, an external current source 502 may be coupled (either temporarily or permanently) during manufacturing to leads 214 and 216. In an embodiment, current source 502 may be a permanent part of the circuitry to which IC device 200' is coupled, or current source 502 may be part of manufacturing test fixtures used to perform test and other functions during manufacturing.

Current source 502 may provide a current sufficient to break the connection provided by conductor 402. Conductor 402 may have a relatively small diameter that provides an electrical resistance. As current from current source 502 flows through conductor 402, heat caused by the resistance may heat conductor 402 until it burns up and breaks the electrical connection. Once fused wire 402 is blown, semiconductor die 202 and 204 may be electrically isolated from each other and may operate according to their design.

In an embodiment, fused wire 402 may have a diameter smaller than and/or a resistivity greater than the diameter of bond wires 220 and 222 so that fused wire 402, and not bond wires 220 and 222 breaks in the presence of current from current source 502. In another embodiment, the diameter of fused wire 402 may be greater than the diameter of bond wires 220 and 222, but is constructed of a material with higher resistivity than that of bond wires 220 and 222.

Figure 6:
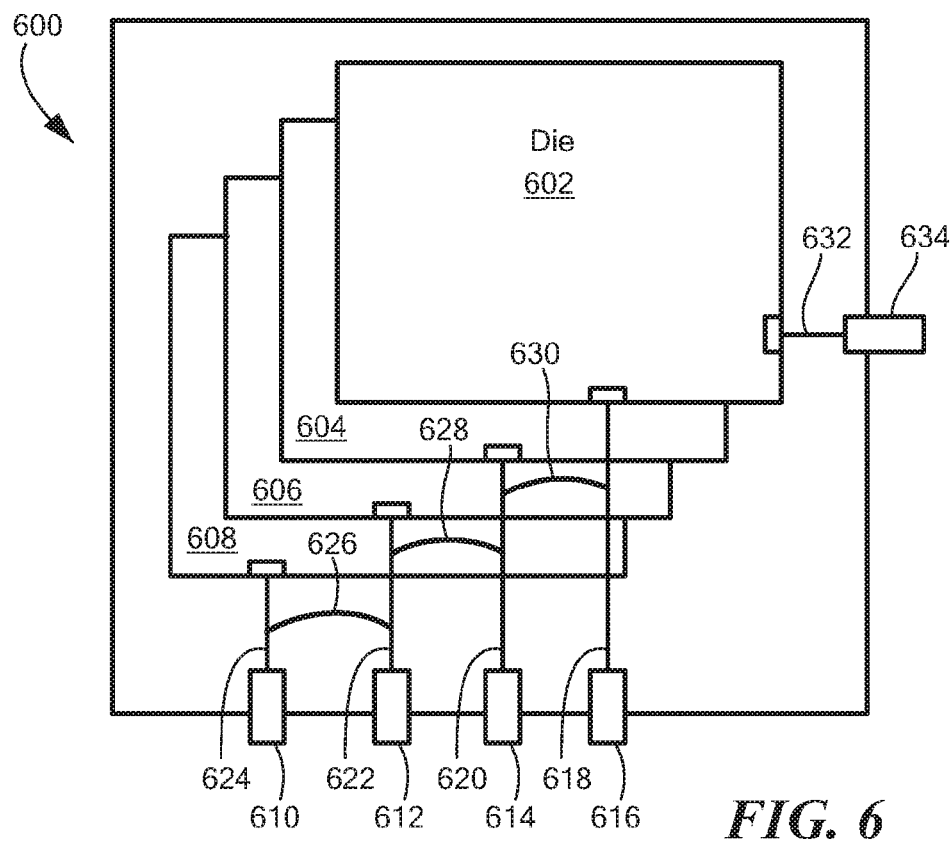
FIG. 6 is a block diagram of an integrated circuit device having multiple semiconductor die and conductors between the die.

FIG. 6 is a block diagram of an IC device 600 that may be the same as or similar to IC device 200 and/or 200'. In an embodiment, IC device 600 includes multiple semiconductor die 602-608. Although four semiconductor die are shown, IC device 600 may include more than four or fewer than four semiconductor die.

For simplicity of illustration, each semiconductor die 604-608 is shown coupled to a single respective bond wire 620-624 with a single connection to a respective lead 610-614. Semiconductor die 602 is shown coupled to bond wires 618 and 632, and to respective leads 616 and 634. In embodiment, each semiconductor die 602-608 may have multiple connections to multiple bond wires and multiple leads.

Fused wires 626-630 may be coupled between bond wires 618-624 as shown to provide conduction paths between all the semiconductor die 602-608. For example, assume an ESD event occurs between lead 634 and lead 612. Current from the ESD event may flow through bond wire 632, through semiconductor die 602, through bond wire 618, through fused wire 630, through bond wire 620, through fused wire 628, through bond wire 622, and finally out to lead 612. This may prevent or minimize the chance of damage due to electrical arcing between the semiconductor die in the case of an ESD or other overvoltage event between pins. One skilled in the art will recognize that fused wires 626-630 may provide electrical conductivity between all semiconductor die 602-608. In other embodiments, one or more of fused wires 626-630 may be omitted if no conduction path between certain die is desired. In another embodiment, fused wires 626-630 may be positioned or coupled to pads on semiconductor die 602-608; positioned adjacent to leads 610-616; or positioned between leads 610-616, lead wires 618-626 and/or pads on semiconductor die 602-608; or any combination thereof. Additionally or alternatively, fused wires 626-630 may be coupled to leads at a point external to the package (e.g. between leads 610-616).

Like fused wire 402, fused wires 626-630 may be broken by application of a current. A current source like current source 502, or other circuit that drives current, may be coupled to the leads 610-616 so that an applied current can break the connection of each fused wire 626-630. In one example, the current source may drive current through one fused wire at a time. The current source may be connected to leads 610 and 612 to apply a current to blow fused wire 626, to leads 612 and 614 to blow fused wire 628, and/or to leads 614 and 616 to blow fused wire 630. In another embodiment, multiple current sources may be used to blow the fused wires simultaneously.

Figure 7:
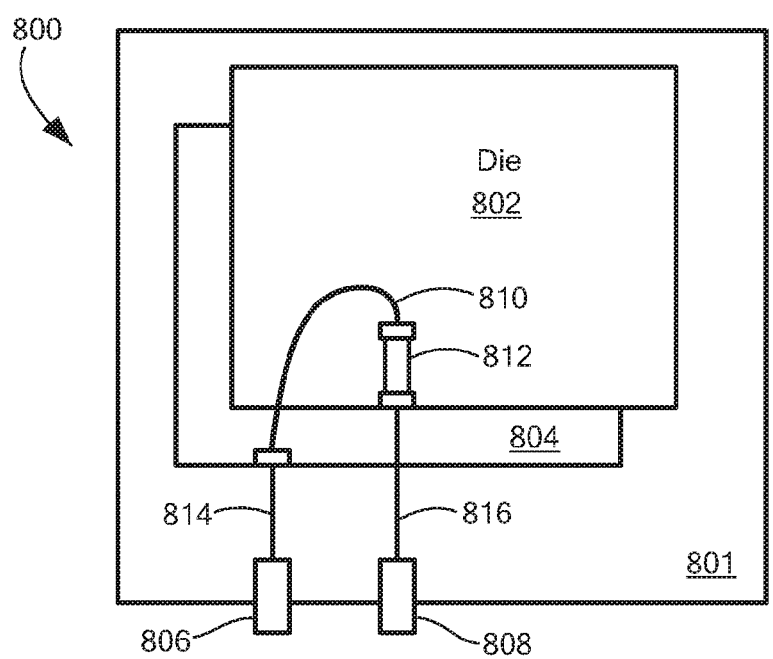
FIG. 7 is a block diagram of an integrated circuit device having multiple semiconductor die and a fuse.

Referring to FIG. 7, an IC device 800 may be the same as or similar to IC devices 200, 200', 400, and/or 600. In an embodiment, IC device 800 includes semiconductor die 802 and semiconductor die 804 within an IC package 801. Lead 806 extends outside of package 801 and is coupled to semiconductor die 804 via bond wire 814. Lead 808 extends outside of package 801 and is coupled to semiconductor die 802 via bond wire 816. Semiconductor die 802 includes on-chip fuse 812. Conductor 810 is coupled to one end of fuse 812 and semiconductor die 804 and/or bond wire 814. The other end of fuse 812 is electrically coupled to bond wire 816. Fuse 812 may be constructed by any means known in the art to construct an on-chip fuse. In an embodiment, fuse 812 may be a slow-blow fuse.

In an embodiment, conductor 810 and fuse 812 provide an overvoltage conduction path between semiconductor die 802 and 804. In the case of an ESD event between leads 806 and 808, for example, current may flow from lead 806, through bond wire 814, through conductor 810, through fuse 812, through bond wire 816, and finally out to lead 808. If other leads (not shown in FIG. 7) are involved in an ESD event, the current associated with the other leads may flow through other circuits and portions of semiconductor die 802 or 804. However, in the case where current needs to flow from one die to another, the current may utilize the conduction path provided by conductor 810 and fuse 812.

Once IC device 800 is installed in situ, the need for an ESD path between semiconductor die 802 and 804 may be reduced. In this case, the conduction path may be broken by applying a current sufficient to blow fuse 812. For example, a current source (the same as or similar to current source 502), or other circuit that provides sufficient current, may be coupled to leads 806 and 808. In another example, a current may be generated internally by the IC elements/circuits. The current source may be used to break the conduction path provided by conductor 810 and fuse 812 by driving a current sufficient to blow fuse 812 through the conduction path. Once fuse 812 is blown, the fuse will be an open circuit so that semiconductor die 802 and 804 are electrically isolated from one another.

Although described as a lead-frame based package, the features described above can also be applied in conjunction with other types of packages. For example, a conductor electrically coupled between the first and second bond wires to allow electrostatic discharge to flow between the first die to the second die can be used in conjunction with package types including, but not limited to: flip-chip, combination of flip-chip with wire-bonding, 3-D IC stacks, wafer-level 3-D stacks, side-by-side or stacked on interposer, etc. In these instances, the conductor can be electrically coupled to one or more connections such as: a bond wire, a bump or micro-bump (e.g. for stacked or side by side flip chip packages), a through-silicon via (TSV) connection (e.g. for 3-D stacked die packages), a directly joined metal interconnect (e.g. for 3-D bonded wafer stacks), etc.

The conductor may also include one or more of: a conductive adhesive, a solder ball, a solder paste, a stud bump, or a wire bond. In an embodiment, the conductor may provide electrical connection between the first die and a lead frame, and/or between the second die and the lead frame. For example, if the conductor includes a conductive adhesive, the adhesive may adhere the first and/or second die to a lead frame. Thus, the adhesive may be in contact with the first and/or second die and with the lead frame, and may provide an electrical connection between the first and/or second die and the lead frame. Examples of conductive paths that include conductive adhesive may be further described in U.S. patent application Ser. No. 15/053,397 (filed Feb. 25, 2016), which is incorporated here by reference in its entirety.

Figure 8:
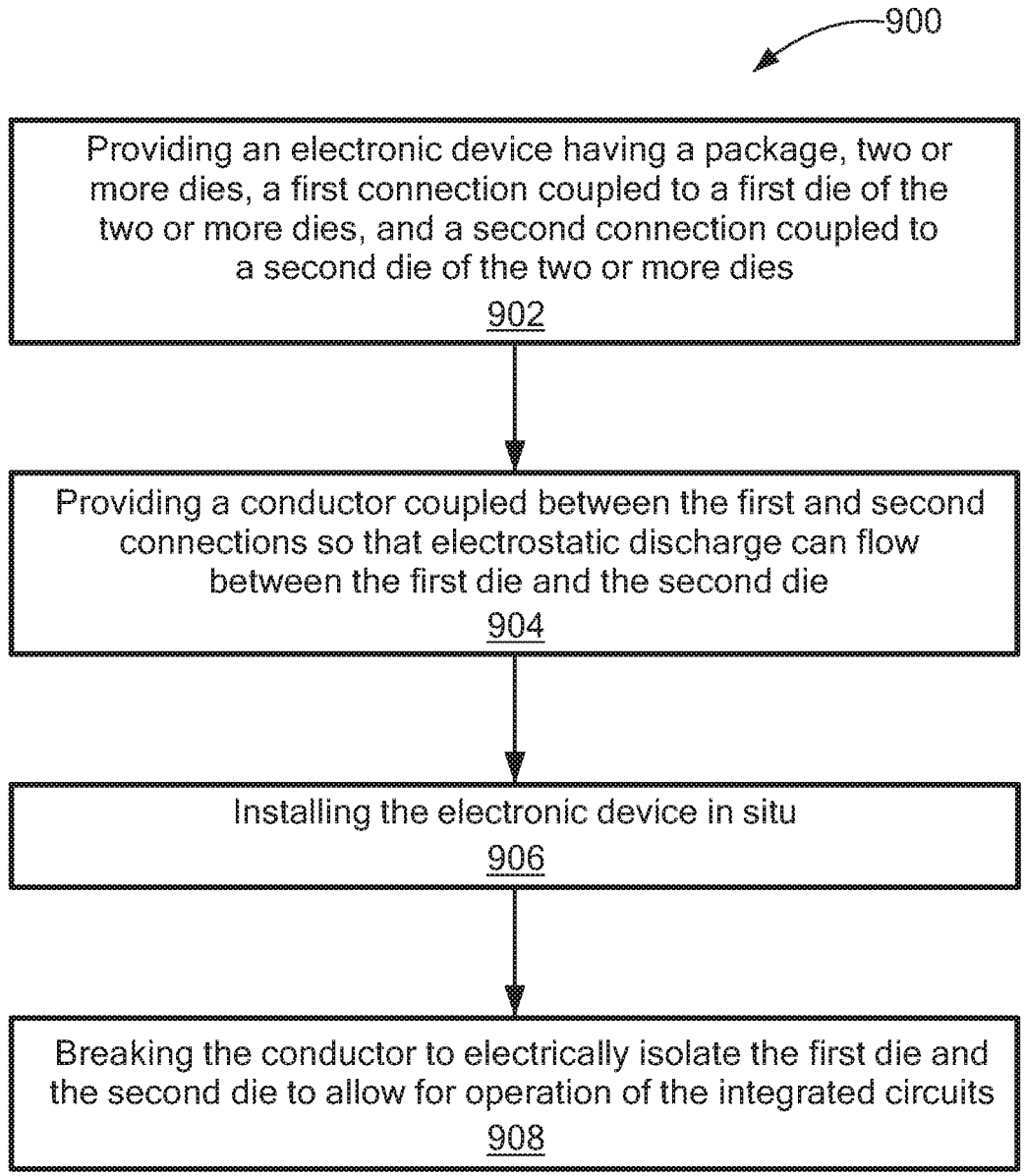
FIG. 8 is a flowchart diagram of a method of protecting an integrated circuit device from electrostatic discharge (ESD) events.

Referring to FIG. 8, a flowchart describes a process 900 for providing ESD protection. In block 902, an electronic device is provided. The electronic device may be the same as or similar to IC device 200', 400, 600, and/or 800. The electronic device may include two or more semiconductor die each having an electrical connection to, for example, a lead extending out of a package of the electronic device. In box 904, a conductor is provided. The conductor is coupled between the first and second die to provide a conduction path for current related to an overvoltage and/or ESD event, for example. The conductor may be the same as or similar to conductor 402, 626, 628, 630, 810, and/or fuse 812.

In box 906, the electronic device is installed in a system. For example, if the electronic device is an automotive magnetic sensor, the electronic device may be installed in the vehicle. In box 908, the conductor (e.g. the conduction path provided by the conductor) is broken so as to electrically isolate the two or more semiconductor die. The conductor may be broken by providing a current that blows the conductor like a fuse, or blows an on-chip fuse that is part of the conduction path, for example.

Having described exemplary embodiments of the invention, one of ordinary skill in the art may recognize that other embodiments incorporating the concepts fall within the scope of the claims. The embodiments described should not be limited to disclosed embodiments but rather should be defined by the claims. All publications and references cited in this document are incorporated here by reference in their entirety.

The invention claimed is:

1. An apparatus comprising:
   a package;
   a plurality of external connections extending outside the package;
   a first die having a first electrical contact coupled to a first connection of the plurality of external connections;
   a second die having a second electrical contact coupled to a second connection of the plurality of external connections; and
   a conductor directly contacting only the first electrical contact and the second electrical contact to allow electrostatic discharge to flow from the first die to the second die and vice versa, wherein the conductor comprises a wire external to the first and second die.

2. The apparatus of claim 1 further comprising a lead frame at least partially internal to the package.

3. The apparatus of claim 1 wherein the conductor is electrically coupled to at least one of the external connections.

4. The apparatus of claim 1 wherein, once the conductor is broken, the first and second die are electrically isolated from each other.

5. The apparatus of claim 1 wherein one or both of the first and second contact is a ground node.

6. The apparatus of claim 1 wherein the conductor comprises a slow-blow fuse.

7. The apparatus of claim 1 wherein the conductor is located adjacent to the first and second die.

8. The apparatus of claim 1 further comprising a plurality of dies, each die having a respective plurality of contacts; and
a plurality of conductors, each conductor directly contacting only one contact of the plurality of contacts of one of the dies and another contact of the plurality of contacts of another of the dies.

9. The apparatus of claim 1 wherein the conductor comprises a fuse.

10. The apparatus of claim 9 wherein the fuse is an on-chip fuse supported by the first or second die.

11. The apparatus of claim 1 wherein the first contact and/or the second contact are selected from the list consisting of: a bond wire, a bump, a micro-bump, a through-silicon via (TSV) connection, a directly joined metal interconnect, and a bond pad.

12. The apparatus of claim 1 wherein the conductor is configured to be broken by application of a predetermined current level.

13. An apparatus comprising:
a package;
a plurality of external connections extending outside the package;
a first die within the package having one or more first contacts;
a first bond wire coupled between one of the contacts of the first die and one or more of the external connections;
a second die within the package having one or more second contacts;
a second bond wire coupled between one of the second contacts of the second die and one or more of the external connections; and
a conductor directly contacting only one of the first contacts of the first die and one of the second contacts of the second die to allow electrostatic discharge to flow between the first die to the second die, wherein the conductor comprises a wire external to the first and second die.

14. The apparatus of claim 13 wherein the conductor comprises a fuse.

15. The apparatus of claim 14 wherein the fuse is an on-chip fuse supported by the first and/or second die.

16. A method of manufacturing comprising:
providing an electronic device having a package, two or more dies, a first connection coupled to a first die of the two or more dies, and a second connection coupled to a second die of the two or more dies, the first and second dies including integrated circuits;
providing a conductor directly contacting only the first connection of the first die and the second connection of the second die so that electrostatic discharge current can flow between the first die to the second die during handing of the electronic device, wherein the conductor comprises a wire external to the first and second die;
installing the electronic device in an application; and
after the electronic device is installed, breaking the conductor to electrically isolate the first die and the second die to allow for operation of the integrated circuits of the first and second die in the application.

17. The method of claim 16 wherein the conductor comprises a fuse and breaking the conductor comprises blowing the fuse.

18. The method of claim 16 wherein the conductor comprises a wire and breaking the conductor comprises applying a predetermined current through the wire.

19. The method of claim 16 wherein the conductor is coupled between the first and second connections during manufacturing of the electronic device.

20. The method of claim 16 wherein breaking the conductor comprises causing an electrical current to flow from the first connection to the second connection through the conductor.

21. The method of claim 16 wherein providing the conductor comprises coupling a bond wire between the first and second connections.

22. The method of claim 16 wherein providing the conductor comprises electrically coupling a fuse supported by the first or second die between the first and second connections.

23. An apparatus comprising:
a package;
a plurality of external connections extending outside the package;
a first die within the package having one or more first contacts;
a first bond wire coupled between one of the first contacts of the first die and one or more of the external connections;
a second die within the package having one or more second contacts;
a second bond wire coupled between one of the second contacts of the second die and one or more of the external connections; and
a conductor directly contacting only the first die and the second die to allow electrostatic discharge to flow between the first die to the second die, wherein the conductor comprises a wire external to the first and second die.

24. The apparatus of claim 23 wherein the conductor comprises a fuse.

25. The apparatus of claim 24 wherein the fuse is an on-chip fuse supported by the first and/or second die.

* * * * *

UNITED STATES PATENT AND TRADEMARK OFFICE
CERTIFICATE OF CORRECTION

PATENT NO.         : 10,145,904 B2
APPLICATION NO.    : 15/245689
DATED              : December 4, 2018
INVENTOR(S)        : Maxim Klebanov et al.

Page 1 of 1

It is certified that error appears in the above-identified patent and that said Letters Patent is hereby corrected as shown below:

In the Specification

Column 4, Line 13, delete "by magnetic" and replace with --by a magnetic--

Column 4, Line 29, delete "circuits to that" and replace with --circuits so that--

Column 4, Line 44, delete "die may be" and replace with --die 202 and 204 may be--

Column 5, Line 22, delete "though" and replace with --through--

Column 5, Line 43, delete "device" and replace with --die--

Column 5, Line 47, delete "devices" and replace with --die--

Column 6, Lines 51-52, delete "In embodiment" and replace with --In an embodiment--

In the Claims

Column 10, Line 11, Claim 16 delete "handing of" and replace with --handling of--

Signed and Sealed this
Seventh Day of May, 2019

Andrei Iancu
*Director of the United States Patent and Trademark Office*